US009306591B2

(12) United States Patent
Khoshgard et al.

(10) Patent No.: US 9,306,591 B2
(45) Date of Patent: Apr. 5, 2016

(54) CALIBRATION OF HIGH SPEED ASYNCHRONOUS CONVERTOR

(71) Applicant: SITUNE CORPORATION, San Jose, CA (US)

(72) Inventors: Mahdi Khoshgard, Los Gatos, CA (US); Vahid Mesgarpour Toosi, Los Altos, CA (US); Yahya Tousi, San Jose, CA (US)

(73) Assignee: SITUNE CORPORATION, San Jose, CA (US)

(*) Notice: Subject to any disclaimer, the term of this patent is extended or adjusted under 35 U.S.C. 154(b) by 0 days.

(21) Appl. No.: 14/273,440

(22) Filed: May 8, 2014

(65) Prior Publication Data
US 2015/0326239 A1 Nov. 12, 2015

(51) Int. Cl.
H03M 1/12 (2006.01)
H03M 1/18 (2006.01)
H03M 1/46 (2006.01)

(52) U.S. Cl.
CPC ............ *H03M 1/183* (2013.01); *H03M 1/46* (2013.01)

(58) Field of Classification Search
CPC ......... H03M 1/183; H03M 1/46; H03M 1/12; H03M 1/001; H03M 1/1009; H03M 13/1111; H03M 13/2957; H03M 13/3972; H03M 13/41; H03M 13/6325; H03M 1/1038; H03M 13/3927
USPC .......................................... 341/120, 118, 161
See application file for complete search history.

(56) References Cited

U.S. PATENT DOCUMENTS

| 5,294,926 | A | 3/1994 | Corcoran |
| 6,384,757 | B1* | 5/2002 | Kosonen ................ 341/120 |
| 7,535,390 | B2 | 5/2009 | Hsu |
| 7,834,786 | B2 | 11/2010 | Kawahito et al. |
| 8,335,979 | B2* | 12/2012 | Pisek et al. ............ 714/800 |
| 8,344,919 | B2* | 1/2013 | Tseng ................ 341/118 |
| 8,368,571 | B2* | 2/2013 | Siragusa ............ 341/120 |
| 8,487,795 | B1 | 7/2013 | Jiang et al. |
| 8,604,954 | B2 | 12/2013 | Chen et al. |
| 8,654,000 | B2 | 2/2014 | Waltari |
| 8,917,125 | B1 | 12/2014 | Waltari |
| 9,030,340 | B1 | 5/2015 | Waltari |
| 2005/0219091 | A1 | 10/2005 | Wood et al. |
| 2005/0225470 | A1* | 10/2005 | Tsai et al. ............ 341/161 |
| 2005/0278611 | A1* | 12/2005 | Park et al. ............ 714/792 |
| 2008/0174461 | A1 | 7/2008 | Hsu |
| 2010/0306208 | A1* | 12/2010 | Haselden et al. ...... 707/756 |

OTHER PUBLICATIONS

Non-Final Office Action in U.S. Appl. No. 14/290,695 mailed Jun. 8, 2015.

* cited by examiner

*Primary Examiner* — Jean B Jeanglaude
(74) *Attorney, Agent, or Firm* — Novak Druce Connolly Bove + Quigg LLP

(57) ABSTRACT

An example method includes extracting calibration coefficients of each stage of a pipeline analog-to-digital convertor (ADC). The calculation of the corrected digital output of the pipeline ADC can be based on the digital output of each pipeline stage and the estimated calibration coefficient of the corresponding stage. Therefore, a relaxed design of the operational amplifier and sizing of capacitors in a high speed asynchronous ADC can be achieved.

20 Claims, 5 Drawing Sheets

CALIBRATION OF HIGH SPEED ASYNCHRONOUS CONVERTOR

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of communications, and more specifically to telecommunication receivers.

BACKGROUND

With high bandwidth applications (e.g., full band cable and satellite receivers, serial links and short range wireless communications) becoming more and more popular, there is increasing demand for high speed and high performance analog-to-digital convertors (ADCs). In the past twenty years, the impact of Moore's law on device scaling has exponentially increased the computing power of digital integrated circuits. However, the improved device scaling has not been as advantageous in analog and mixed signal circuits. As devices' scale becomes smaller, a decreased requirement in supply voltage results in smaller dynamic range of signals. In the meanwhile, analog signal processing (e.g., comparison and amplification) is limited by operational amplifier (op-amp) gain and device mismatch.

Further, the analog metrics have become even more challenging at deeply scaled CMOS technologies. For example, a limited gain of op-amps, as well as comparator mismatch, can limit the maximum number of bits in a data converter. The challenge is more severe at high frequency applications (e.g., telecommunication receivers) where op-amp and comparator accuracy is inevitably traded for higher bandwidth.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Systems and methods in accordance with various embodiments of the present disclosure may overcome one or more of the foregoing or other deficiencies experienced in conventional approaches for wireless and/or wired communication. In particular, various embodiments describe systems and methods for estimating calibration coefficients of an asynchronous ADC and calculating a corrected digital output based at least in upon the estimated calibration coefficients. In accordance with various embodiments, the present disclosure describes methods to extract calibration coefficients at each stage of a pipeline ADC and the calculation of the corrected digital output of the pipeline ADC can be based on the digital outputs of all pipeline stages and their corresponding estimated calibration coefficients. Therefore, unlike some conventional pipeline ADCs, the gain of each pipeline does not need to be accurately set, which allows for a relaxed design of the operational amplifier and sizing of capacitors in a high speed asynchronous ADC.

Various other applications, processes, and uses are presented below with respect to the various embodiments.

Figure 1:
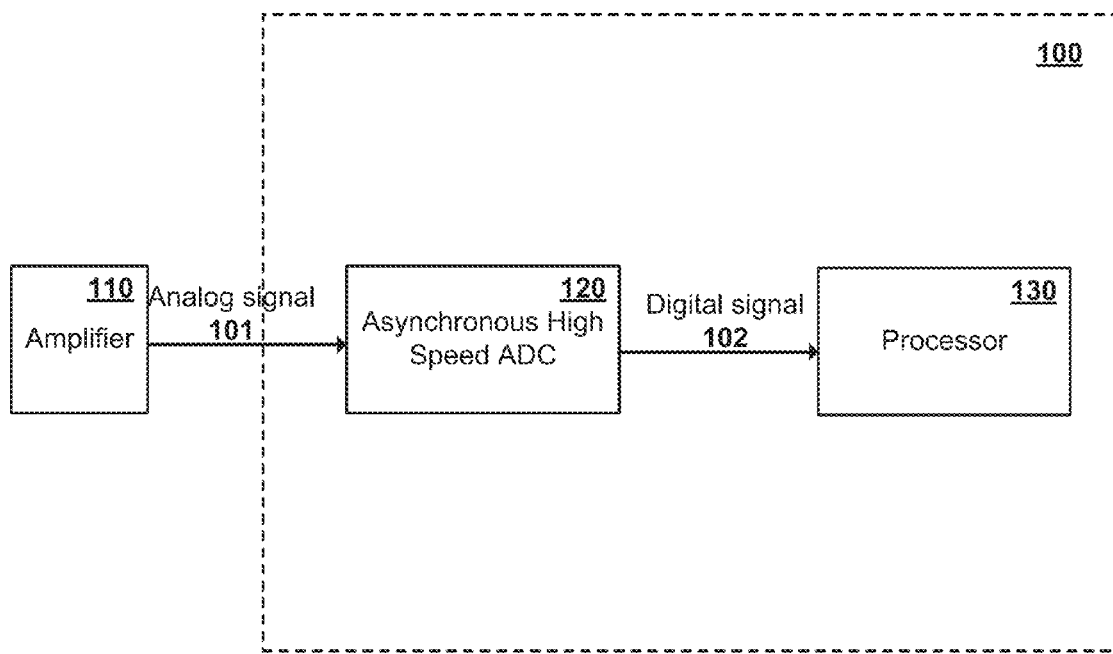
FIG. 1 illustrate an example wideband receiver in accordance with various embodiments.

FIG. 1 illustrates an example wideband receiver 100 in accordance with various embodiments. In this example, the wideband receiver 100 comprises an asynchronous high speed analog-to-digital converter (ADC) 120 (e.g., a pipeline ADC) and at least one processor 130. In this example, a wideband analog signal is amplified by an amplifier 110 (e.g., a front-end amplifier or low-noise amplifier (LNA)). The amplifier 110 may be configured to amplify possibly very weak signals. In some embodiments, the output analog signal 101 of the amplifier 110 is connected to the asynchronous high speed ADC 110 without being filtered or mixed. The asynchronous high speed ADC 110 converts the analog signal 101 to a digital signal 102. The at least one processor 130 receives the digital signal 102 for data processing. Although only one processor is shown in FIG. 1, one or more various types of electronic or computing devices that are capable of processing data may be used. The processor may use operating systems that include, but are not limited to, Android, Berkeley Software Distribution (BSD), iPhone OS (iOS), Linus, OS X, Unix-like Real-time Operating System (e.g., QNX), Microsoft Windows, Window Phone, and IBM z/OS.

In some embodiments, the wideband receiver 100 may also include one or more memory devices for storing instructions and data. As would be apparent to one of ordinary skill in the art, the one or more memory devices can include many types of memory, data storage, or computer-readable media, such as a data storage for program instructions for execution by the at least one processor 130 and/or being used for storing data, a removable memory available for sharing information with other devices, and any number of computing approaches available for sharing with other processors. The example wideband receiver 100 may also include power components, such as conventional plug-in approaches, a battery operable to be recharged through conventional plug-in approaches, or through other approaches such as wireless (e.g., capacitive or inductive) charging through proximity with a power mat or other such device. Various other elements and/or combinations are possible as well within the scope of various embodiments.

Various embodiments apply to wideband applications. These applications include, but are not limited to, cable and satellite full band receivers, wireline and wireless communication, imaging and video, signal surveillance, electronic warfare, test equipment, transmitters, and radar and data communications.

Figure 2:
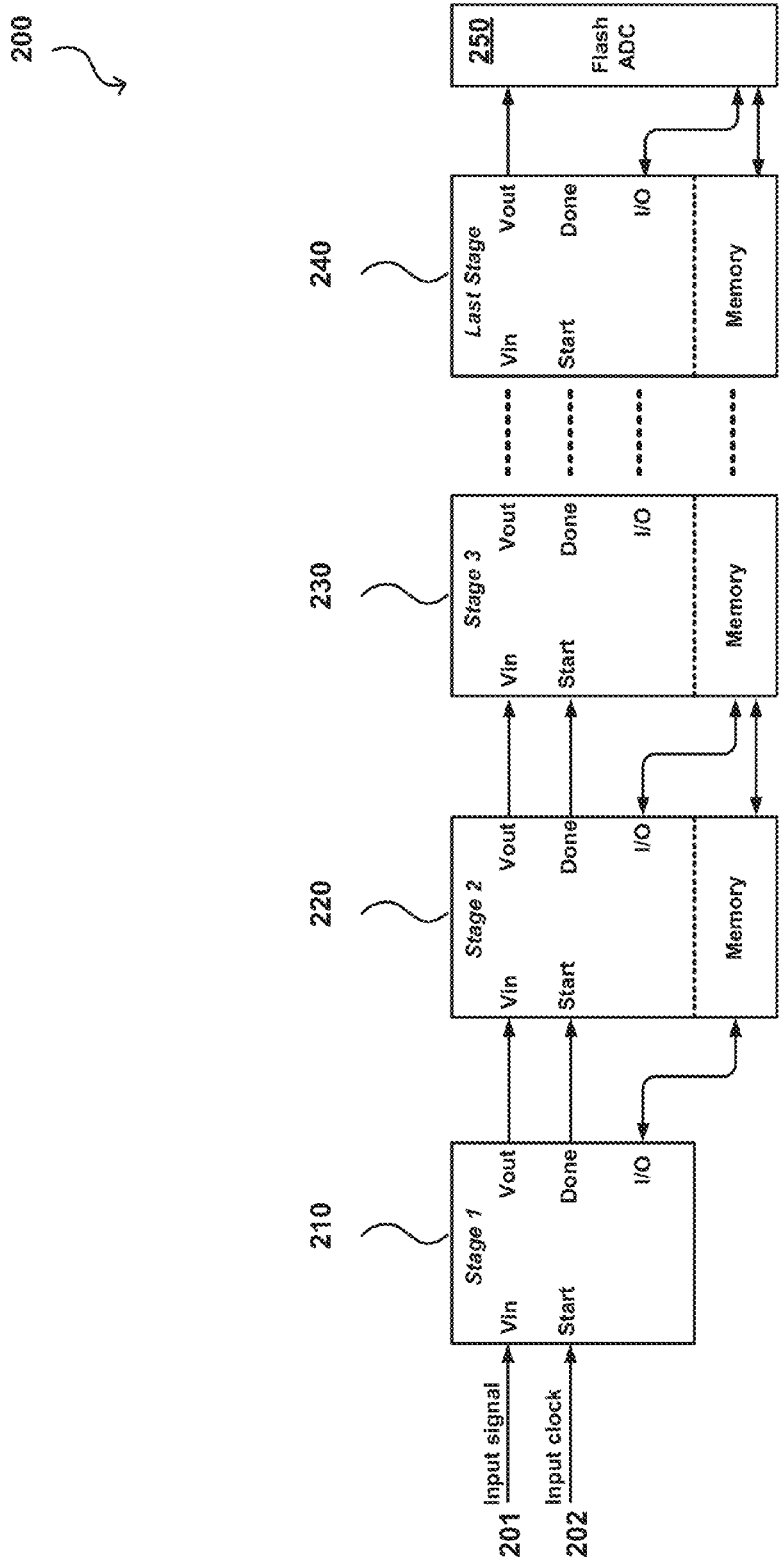
FIG. 2 illustrates an example of a pipeline ADC in accordance with various embodiments.

FIG. 2 illustrates an example of an asynchronous high speed ADC, for example, a pipeline ADC 200, in accordance with various embodiments. The pipeline ADC 200 comprises a plurality of pipeline stages, a Stage1 210, Stage2 220, Stage3 230, and a Last Stage 240. Although only four pipeline stages are shown in FIG. 2, it should be understood that the pipeline ADC may include various numbers of pipeline stages that capable of digitizing one or more bits of an input signal in accordance with various embodiments discussed herein. The Stage1 210 is coupled to an input signal 201 and an input clock 202. Each stage of the pipeline ADC 200 digitizes one or more bits of the input signal 201 and forwards the residue signal to the next stage for further digitization. In some embodiments, the Last Stage 240 is coupled to a flash ADC 250, which can be used for calibration. A pipeline stage (e.g., pipeline stages 210, 220, 230 or 240) may also include an I/O interface to communicate with or receive feedback from a downstream pipeline stage or the flash ADC 250. In some instances, a pipeline stage may also include a memory to store one or more correction parameters of the pipeline stage.

In this example, stages in the plurality of stages in the pipeline ADC 200 can be self-timed and work asynchronously with respect to each other. For example, each of the plurality of stages, except the Stage1 210, waits for the previous stage to finish digitizing one or more bits of the input signal 201 and then starts to digitize the residue digits forwarded from the previous stage. The exemplary self-timing stages are advantageous over prior systems because only limited clock routing between stages are needed. Not only long global routing for the plurality of pipeline stages but also the memory I/O bits can be avoided. Therefore, high sampling rates can be achieved in this example pipeline ADC 200 without the possible limitations of unpredictable clock skew and delay.

In some embodiments, the pipeline ADC 200 may also include a sample-and-hold (S&H) circuit. The analog input to the pipeline ADC 200 is first sampled and held steady by the S&H before being quantized into one or more bits by the Stage1 210. The output with the one or more bits is then fed to a digital-to-analog converter (DAC). The analog output of the DAC is then subtracted from the analog input. The "residue" analog signal is amplified and provided to the next stage, Stage2 220. This amplified residue analog signal continues through the pipeline, providing one or more bits per stage until it reaches the last pipeline stage 240 or the flash ADC 250, which resolves one or more least significant bits (LSB). Because the bits from each stage are determined at different points in time, all the bits corresponding to the same sample signal can be time-aligned with shift registers. In some embodiments, the time-aligned signal can be fed to a digital-error-correction logic.

Figure 3:
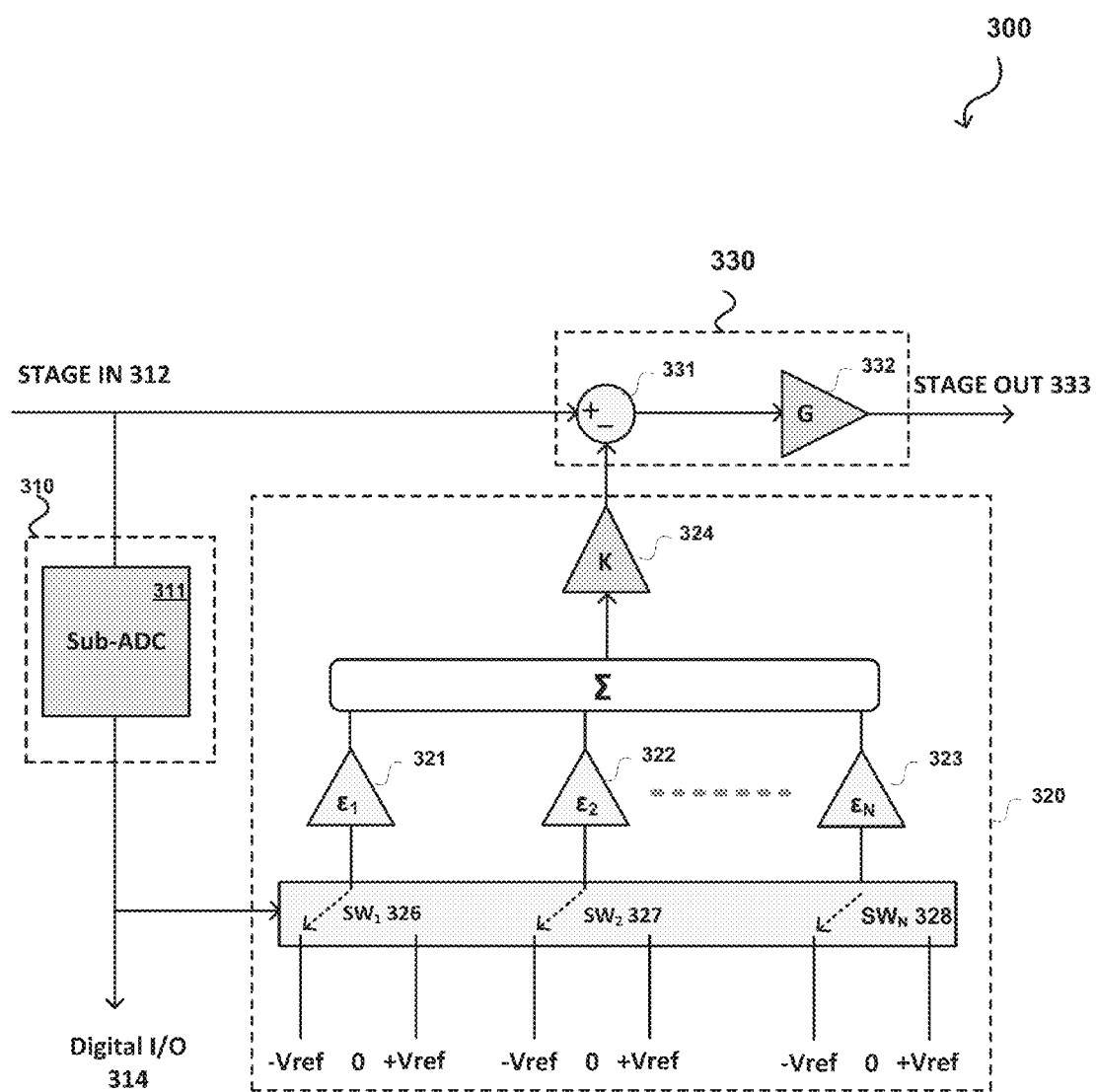
FIG. 3 illustrates an example stage in the example pipeline ADC of FIG. 2 in accordance with various embodiments.

FIG. 3 illustrates an example stage 300 in the pipeline ADC of FIG. 2 in accordance with various embodiments. In this example, the stage 300 (e.g., the Stage2 220 of FIG. 2) comprises a number a sections. For example, as shown, the pipeline can include a first section 310, second section 320, and third section 330. The first section 310 is coupled to a stage-in signal 312 and includes a sub-ADC 311 that can extract a bit number, n; where n is the number of bits that the stage 300 will extract. An output signal of the sub-ADC 311 is coupled to a Digital I/O of the stage 300 and the second section 320. The second section 320 can be a digital-to-analog converter (DAC) that comprises a plurality of switches, $SW_1$ 326, $SW_2$ 327 $SW_N$ 328, and a reference voltage, $V_{ref}$. In some embodiments, the second section 320 is controlled by the output signal of the sub-ADC 311. An output signal of the second section 320 is coupled to the third section 330. The third section 330 includes an operational amplifier 332 that amplifies the difference between the stage-in signal 312 and the output signal of the second section 320. The difference can be subtracted by a subtraction circuit 331.

In some embodiments, the section three 330 further includes a sample-and-hold (S&H) circuit that is coupled between the stage-in signal 312 and the subtraction circuit 331. During normal operation, the S&H circuit and the sub-ADC 311 acquire the stage-in signal 312. The sub-ADC 311 converts the stage-in signal 312 to digital data. The conversion result forms the most significant bits of the digital output. The digital output signal is then fed into the DAC in the section two 320. The output signal of the section two 320 is subtracted from the stage-in signal 312. The residual analog signal is then amplified into a stage-out signal 333 and sent to the next stage in the pipeline to be sampled and converted as in the stage 300. In some embodiments, this process is repeated through suitable stages to achieve the desired resolution. For example, a pipeline DAC with p pipelined stages, each with an n-bit sub-ADC, can produce a high speed ADC with a resolution of m=p*n bits.

In some embodiments, the time aperture between the sampling of a S&H circuit and signal quantization in the sub-ADC 311 is minimized to avoid signal-dependent conversion errors. In some embodiments, in order to maximize the settling time of the section two 320 (e.g., to achieve a high conversion speed), the sub-ADC 311 is configured to provide its digital output 314 to the DAC in the section two 320 when the S&H circuit samples the stage-in signal 312 and enters the hold mode (e.g., in the next clock cycle).

In many instances, a pipeline stage can have multiple imperfections that affect the overall characteristic of the stage. The imperfection may come from various sources (e.g., a finite open loop gain of the stage's amplifier(s), and geometric mismatch between devices during fabrication). For example, one type of imperfection may come from the imperfect gain of an operational amplifier, which results in a gain of G that is lower than that from an ideal stage. The lower the open-loop gain of the operational amplifier, the more the stage gain drops below an ideal value. In an un-calibrated ADC, this difference can result in spectrum non-linearity that limits the number of bits converted by the ADC. A second type of imperfection may come from variations of the reference voltage, $V_{ref}$. In FIG. 3, the non-ideal reference voltage is illustrated by an unknown gain, K 324. A third source of imperfection may come from mismatches between capacitors of the plurality of switches, $SW_1$ 326, $SW_2$ 322, $SW_N$ 328. The effect of the mismatches between switches is illustrated by placing separate gains, $\epsilon_1$ 321, $\epsilon_2$ 322, $\epsilon_N$ 323, in the path of the signal in the section two 320.

In some embodiments, the stage 300 has a plurality of imperfections, N+2. To calibrate the stage 300, each of the plurality of imperfections needs to be estimated and compensated for. In some instances, there are N independent parameters in the plurality of imperfections, N+2. Various embodiments extract these independent parameters to calibrate the stage 300.

Figure 4:
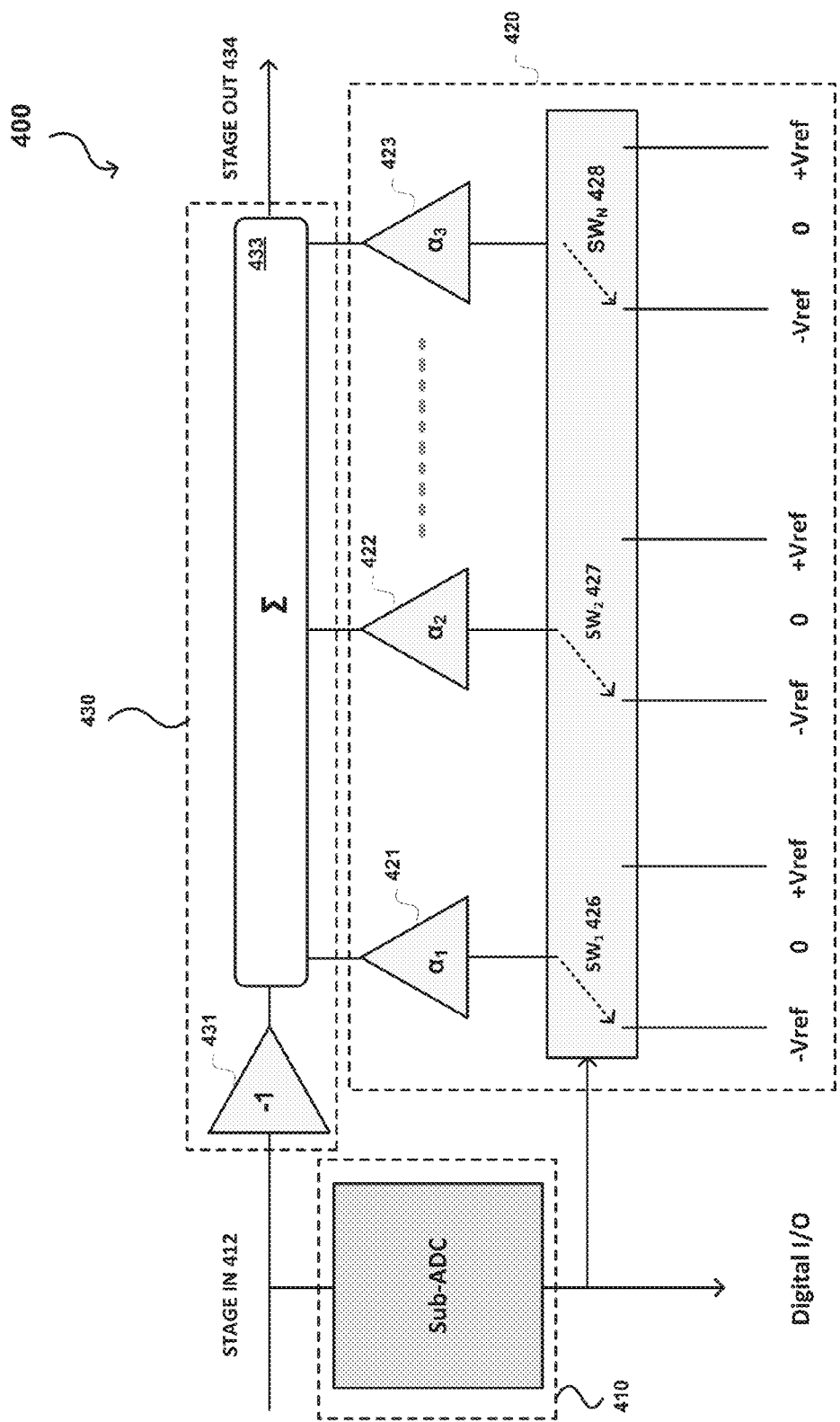
FIG. 4 illustrates a model of an exemplary gain stage in accordance with various embodiments.

FIG. 4 illustrates a model of an exemplary pipeline stage 400 in accordance with various embodiments. In this example, unknown independent parameters in the stage 400 are represented in a linear model. Various embodiments provide one or more calibration algorithms to extract these independent parameters in the stage 400. The stage 400 comprises three sections 410, 420 and 430. N independent parameters of the stage 400 can be extracted and applied as coefficients to an output signal of the stage 400 by a calibration process.

In some embodiments, the calibration process of a pipeline stage can start by connecting the input of the pipeline stage to a fixed voltage. The output of each pipeline stage can be altered by changing the position of N switches in the corresponding stage. For example, the stage-in signal 412 can be a fixed voltage. Two stage-out signals 434 can be recorded when the switch SW1 426 is connected to $-V_{ref}$ and when the switch SW1 426 is connected to $+V_{ref}$, respectively. The difference between these two stage-out signals is a known function of $\alpha_1$ 421, which is an unknown independent parameter of the stage 400. In some embodiments, different levels of reference voltages can be used in determining the $\alpha_1$ 421 (e.g., different reference voltage levels implemented by a resistor string).

In some embodiments, the calibration process of a pipeline stage can start by connecting the input of the pipeline stage to a fixed voltage. The output of each pipeline stage can be altered by changing the position of N switches in the corresponding stage. For example, the stage-in signal 412 can be a fixed voltage. Two stage-out signals 434 can be recorded when the switch SW1 426 is connected to $-V_{ref}$ and when the switch SW1 426 is connected to $+V_{ref}$, respectively. The difference between these two stage-out signals is a known function of $\alpha_1$ 421, which is an unknown independent parameter of the stage 400. In some embodiments, different levels of reference voltages can be used in determining the $\alpha_1$ 421 (e.g., different reference voltage levels implemented by a resistor string).

The same procedures can be repeated for the rest of switches SW$_2$ 427 . . . SW$_N$ 428 to extract unknown independent parameters, $\alpha_2$ 422, $\alpha_N$ 423, respectively. Therefore, N unknown independent parameters in the stage 400 can be extracted by changing N switches in the stage 400. The imperfection represented by these N independent parameters can be represented by a sum 433 and compensated by a gain 431. By performing the calibration steps for all the remaining stages in a pipeline ADC, all N independent parameters in each pipeline stage can be extracted and calibrated. The extracted parameters can be stored and applied as coefficients to an output signal of each pipeline stage during normal operations. In some embodiments, the calibration process of a pipeline ADC can start from the last stage and then proceed to the upstream pipeline stages.

In some embodiments, a digital calibration can comprise two sections, estimation and correction. The estimation section can be performed during a start-up of the pipeline ADC according to one or more calibration algorithms. For example, the one or more calibration algorithms can start from the last pipeline stage and apply a known input signal to that stage. In some embodiments, the last pipe line stage is connected to a flash ADC. In some instances, the flash ADC can contain many digital decoding functions and be integrated in the same integrated circuit (IC) or connected as a discrete circuit component. The combination of the digital output of the last pipeline stage and the flash ADC can be used to calculate and store independent parameters and/or their corresponding calibration coefficients of the last pipeline stage. When the last pipeline stage is calibrated, the one or more calibration algorithms can move to the upstream pipeline stage and perform the same calibration process. In this upstream pipeline stage, the combination of the flash ADC and downstream pipeline stages can be used for calibrating this stage. Utilizing all downstream pipeline stages can be important since calibration accuracy needs to be more accurate for upstream pipeline stages. The one or more calibration algorithms can continue with all the remaining pipeline stages by applying a known input signal and extracting independent parameters of each of these pipeline stages. The corresponding calibration coefficients of each pipeline stage can be calculated and stored.

The correction section can be a back-end digital block that calculates the corrected digital output based at least upon the calculated coefficients of each pipeline stage of the pipeline ADC. In some embodiments, the digital block of the correction section is composed of a series of adders and shift registers and does not require any multiplier. For example, the calculated digital output of a pipeline ADC is a bitwise product between the coefficients of each pipeline stage and individual output of the corresponding stage. Thus, the output is in effect of multiplying the coefficients by 0 or 1, which can be essentially a multiplexer. The output of these multiplexes can be added to generate a corrected output signal. In this example, the digital block of the correction section can run much faster than a typical correction section because the correction does not require any multiplications.

Figure 5:
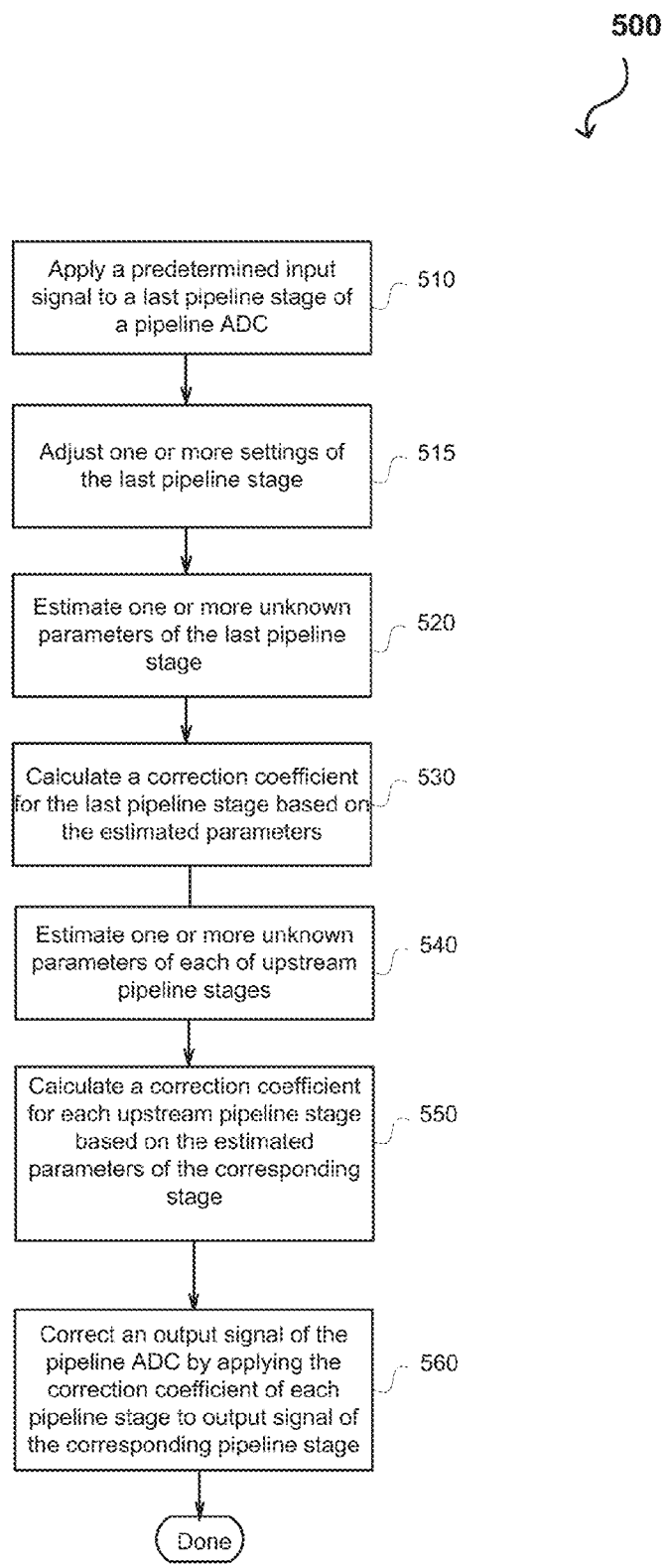
FIG. 5 illustrates an example process of calibrating a high speed asynchronous ADC in accordance with various embodiments.

FIG. 5 illustrates an example process of calibrating a high speed asynchronous ADC in accordance with various embodiments. It should be understood that there can be additional, fewer, or alternative steps performed in similar or alternative orders, or in parallel, within the scope of the various embodiments unless otherwise stated. The example method embodiment 500 starts with applying a known input signal to a last pipeline stage of a pipeline ADC, at step 510. In some embodiments, the last pipeline stage may be connected to a flash ADC. One or more settings (e.g., a reference voltage) of the last pipeline stage can be adjusted, at step 515. One or more unknown parameters of the last pipeline stage can be estimated based at least upon the known input signal, the output of the last pipeline stage, and/or the output of the flash ADC, at step 520. A correction coefficient of the last pipeline stage can be calculated based on the estimated parameters, at step 530.

The same calibration process can be repeated and applied to each upstream pipeline stage of the pipeline ADC. For example, one or more correction parameters of the upstream stage of the last pipeline stage can be estimated based at least upon the known input signal, the outputs of the last pipeline stage and the instant stage, and/or the output of the flash ADC. Similarly, one or more unknown parameters of each of upstream pipeline stages can be estimated, at step 540. A correction coefficient for each upstream pipeline stage can be calculated based on the estimated parameters of the corresponding pipeline stage, at step 550. An output signal of the pipeline ADC can be corrected by applying the correction coefficient of each pipeline stage to an output signal of the corresponding stage, at step 560.

Various embodiments of the present disclosure provide methods for estimating calibration coefficients of an asynchronous ADC and calculating a corrected digital output. While specific examples have been cited above showing how the optional operation may be employed in different instructions, other embodiments may incorporate the optional operation into different instructions. For clarity of explanation, in some instances the present disclosure may be presented as including individual functional blocks including functional blocks comprising devices, device components, steps or routines in a method embodied in software, or combinations of hardware and software.

The various embodiments can be further implemented in a wide variety of operating environments, which in some cases can include one or more computing devices which can be used to operate any of a number of applications. The one or more processors or computing devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent embodiments, or portions thereof, are implemented in hardware, the present invention may be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most embodiments utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The wideband receiver can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The foregoing description of embodiments of the present invention has been provided for the purposes of illustration and description. It is not intended to be exhaustive or to limit the invention to the precise forms disclosed. Many modifications and variations will be apparent to one of ordinary skill in the relevant arts. For example, steps preformed in the embodiments of the invention disclosed can be performed in alternate orders, certain steps can be omitted, and additional steps can be added. The embodiments were chosen and described in order to best explain the principles of the invention and its practical application, thereby enabling others skilled in the art to understand the invention for various embodiments and with various modifications that are suited to the particular used contemplated. It is intended that the scope of the invention be defined by the claims and their equivalents.

What is claimed is:

1. A computer-implemented method, comprising:
   applying a predetermined input signal to a last pipeline stage of a pipeline analog-to-digital converter (ADC), the pipeline ADC comprising a plurality of pipeline stages;
   adjusting one or more settings of the last pipeline stage;
   estimating one or more correction parameters of the last pipeline stage;
   calculating a correction coefficient for the last pipeline stage based at least in part upon the estimated one or more correction parameters of the last pipeline stage;
   estimating one or more correction parameters of each of remaining pipeline stage(s) in the pipeline ADC;
   calculating a correction coefficient of each of the remaining pipeline stage(s) based at least upon the estimated one or more correction parameters of the corresponding pipeline stage; and
   correcting an output signal of the pipeline ADC by applying the correction coefficient of each of the plurality of pipeline stages to the corresponding pipeline stage.

2. The computer-implemented method of claim 1, wherein the pipeline ADC comprises a back-end digital block that is configured to determine the corrected output signal of the pipeline ADC based at least upon the correction coefficients of the plurality of pipeline stages, the back-end digital block including a plurality of adders and a plurality of shift registers.

3. The computer-implemented method of claim 1, wherein each of the plurality of pipeline stages comprises a first section, second section and third section, the first section including a sub-ADC configured to extract one or more bits from an analog input signal of the corresponding pipeline stage, the second section comprising a digital-to-analog converter (DAC) including a plurality of switches, the third section comprising an operational amplifier configured to amplify a residue signal of the analog input signal of the corresponding pipeline stage subtracting the DAC's output signal.

4. The computer-implemented method of claim 3, wherein the pipeline ADC further comprises a flash ADC that is connected to the last pipeline stage.

5. The computer-implemented method of claim 4, wherein the one or more correction parameters of the last pipeline stage is estimated based at least upon the predetermined input signal, or output signals of the last pipeline stage and the flash ADC.

6. The computer-implemented method of claim 3, further comprising:
   applying the predetermined input signal to a particular stage of the plurality of pipeline stages;
   connecting one of the plurality of the switches in the second section of the particular stage to a reference voltage;
   connecting the one of the plurality of the switches in the second section of the particular stage to a different reference voltage; and
   estimating one of the one or more correction parameters of the corresponding pipeline stage based at least upon the predetermined input signal, a difference in the particular stage's output signals under the reference voltage and the different reference voltage, or output signal(s) of the particular stage's downstream stage(s) in the pipeline ADC.

7. The computer-implemented method of claim 6, wherein the reference voltage and the different reference voltage are implemented by using a resistor string.

8. The computer-implemented method of claim 3, wherein the plurality of pipeline stages includes at least one pipeline stage comprising a sample-and-hold (S&H) circuit, the S&H circuit coupled to an input analog signal and the third section of the corresponding stage.

9. The computer-implemented method of claim 8, wherein the sub-ADC is configured to provide a digital output signal to the DAC in the second section when the S&H circuit samples the input analog signal of the corresponding stage and enters a hold mode.

10. The computer-implemented method of claim 1, wherein the one or more settings of the last pipeline stage include one or more levels of reference voltages.

11. A receiver, comprising:
    at least one processor; and
    a memory device including instructions that, when executed by the at least one processor, enable the receiver to:
      apply a predetermined input signal to a last pipeline stage of a pipeline analog-to-digital converter (ADC) in the receiver, the pipeline ADC comprising a plurality of pipeline stages;
      adjust one or more settings of the last pipeline stage;
      estimate one or more correction parameters of the last pipeline stage;
      calculate a correction coefficient for the last pipeline stage based at least in part upon the estimated one or more correction parameters of the last pipeline stage;
      estimate one or more correction parameters of each of remaining pipeline stage(s) in the pipeline ADC;
      calculate a correction coefficient of each of the remaining pipeline stage(s) based at least upon the estimated one or more correction parameters of the corresponding pipeline stage; and
      correct an output signal of the pipeline ADC by applying the correction coefficient of each of the plurality of pipeline stages to the corresponding pipeline stage.

12. The receiver of claim 11, wherein the receiver further comprises a back-end digital block, the instructions when executed further cause the back-end digital block to:
    determine the corrected output signal of the pipeline ADC based at least upon the correction coefficients of the plurality of pipeline stages, the back-end digital block including a plurality of adders and a plurality of shift registers.

13. The receiver of claim 11, wherein each of the plurality of pipeline stages comprises a first section, second section and third section, the first section including a sub-ADC, the second section comprising a digital-to-analog converter (DAC) including a plurality of switches, the third section comprising an operational amplifier,
    the instructions when executed further cause the sub-ADC to:
      extract one or more bits from an analog input signal of the corresponding pipeline stage; and
    the instructions when executed further cause the operational amplifier to:
      amplify a residue signal of the analog input signal of the corresponding pipeline stage subtracting the DAC's output signal.

14. The receiver of claim 13, wherein the pipeline ADC further comprises a flash ADC that is connected to the last pipeline stage, the instructions when executed further cause the receiver to:
    estimate the one or more correction parameters of the last pipeline stage based at least upon the predetermined input signal, or output signals of the last pipeline stage and the flash ADC.

15. The receiver of claim 13, wherein the instructions when executed further cause the receiver to:
- apply the predetermined input signal to a particular stage of the plurality of pipeline stages;
- connect one of the plurality of the switches in the second section of the particular stage to a reference voltage;
- connect the one of the plurality of the switches in the second section of the particular stage to a different reference voltage; and
- estimate one of the one or more correction parameters of the corresponding pipeline stage based at least upon the predetermined input signal, a difference in the particular stage's output signals under the reference voltage and the different reference voltage, or output signal(s) of the particular stage's downstream stage(s) in the pipeline ADC.

16. The receiver of claim 15, wherein the instructions when executed further cause the receiver to:
- implement the reference voltage and the different reference voltage by using a resistor string.

17. The receiver of claim 13, wherein the plurality of pipeline stages include at least one pipeline stage comprising a sample-and-hold (S&H) circuit, the S&H circuit coupled to an input analog signal and the third section of the corresponding stage, the instructions when executed further cause the sub-ADC to:
- provide a digital output signal to the DAC in the second section when the S&H circuit samples the input analog signal of the corresponding stage and enters a hold mode.

18. A non-transitory computer-readable storage medium including instructions that, when executed by at least one processor of a receiver, cause the receiver to:
- apply a predetermined input signal to a last pipeline stage of a pipeline analog-to-digital converter (ADC) in the receiver, the pipeline ADC comprising a plurality of pipeline stages;
- adjust one or more settings of the last pipeline stage;
- estimate one or more correction parameters of the last pipeline stage;
- calculate a correction coefficient for the last pipeline stage based at least in part upon the estimated one or more correction parameters of the last pipeline stage;
- estimate one or more correction parameters of each of remaining pipeline stage(s) in the pipeline ADC;
- calculate a correction coefficient of each of the remaining pipeline stage(s) based at least upon the estimated one or more correction parameters of the corresponding pipeline stage; and
- correct an output signal of the pipeline ADC by applying the correction coefficient of each of the plurality of pipeline stages to the corresponding pipeline stage.

19. The non-transitory computer-readable storage medium of claim 18, wherein each of the plurality of pipeline stages comprises a first section, second section and third section, the first section including a sub-ADC, the second section comprising a digital-to-analog converter (DAC) including a plurality of switches, the third section comprising an operational amplifier,
- the instructions when executed further cause the sub-ADC to:
  - extract one or more bits from an analog input signal of the corresponding pipeline stage; and
- the instructions when executed further cause the operational amplifier to:
  - amplify a residue signal of the analog input signal of the corresponding pipeline stage subtracting the DAC's output signal.

20. The non-transitory computer-readable storage medium of claim 19, wherein the instructions when executed further cause the receiver to:
- apply the predetermined input signal to a particular stage of the plurality of pipeline stages;
- connect one of the plurality of the switches in the second section of the particular stage to a reference voltage;
- connect the one of the plurality of the switches in the second section of the particular stage to a different reference voltage; and
- estimate one of the one or more correction parameters of the corresponding pipeline stage based at least upon the predetermined input signal, a difference in the particular stage's output signals under the reference voltage and the different reference voltage, or output signal(s) of the particular stage's downstream stage(s) in the pipeline ADC.

* * * * *